(12) United States Patent
Yan et al.

(10) Patent No.: US 11,257,557 B2
(45) Date of Patent: Feb. 22, 2022

(54) ONE-TIME PROGRAMMABLE MEMORY AND AN OPERATION METHOD THEREOF

(71) Applicant: SHANGHAI HUALI MICROELECTRONICS CORPORATION, Shanghai (CN)

(72) Inventors: Ying Yan, Shanghai (CN); Jianming Jin, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 0 days.

(21) Appl. No.: 17/206,631

(22) Filed: Mar. 19, 2021

(65) Prior Publication Data
US 2021/0312998 A1 Oct. 7, 2021

(30) Foreign Application Priority Data

Apr. 7, 2020 (CN) .......................... 202010264644.7

(51) Int. Cl.
G11C 17/00 (2006.01)
G11C 17/18 (2006.01)
G11C 17/16 (2006.01)

(52) U.S. Cl.
CPC .............. *G11C 17/18* (2013.01); *G11C 17/16* (2013.01)

(58) Field of Classification Search
CPC .................................. G11C 17/18; G11C 17/16
USPC ............................................................ 365/96
See application file for complete search history.

(56) References Cited

U.S. PATENT DOCUMENTS 9,899,100 B2 * 2/2018 Jeong ................ H01L 29/42368

* cited by examiner

Primary Examiner — Huan Hoang
(74) Attorney, Agent, or Firm — Alston & Bird LLP

(57) ABSTRACT

A one-time programmable (OTP) memory cell is disclosed, which comprises an electric fuse structure, an anti-fuse transistor and a word select transistor. One end of the electric fuse structure is electrically connected to a gate of the anti-fuse transistor to form a first port of the OTP memory cell, the other end of the electric fuse structure is electrically connected to a source of the anti-fuse transistor and is connected to a drain of the word select transistor, and a gate and a source of the word select transistor form a second port and a third port of the OTP memory cell respectively. The operation method of the OTP memory cell has the capability of one-time correction, expanding the practicability of the OTP memory cell.

10 Claims, 4 Drawing Sheets

ONE-TIME PROGRAMMABLE MEMORY AND AN OPERATION METHOD THEREOF

CROSS-REFERENCES TO RELATED APPLICATIONS

This application claims the priority to Chinese patent application No. CN 202010264644.7, filed on Apr. 7, 2020 at CNIPA, and entitled "A ONE-TIME PROGRAMMABLE MEMORY AND AN OPERATION METHOD THEREOF", the disclosure of which is incorporated herein by reference in entirety.

TECHNICAL FIELD

The disclosure relates to the field of integrated circuit design, in particular to a one-time programmable (OTP) memory and an operation method thereof in the field of integrated circuit design.

BACKGROUND

A fuse sometimes refers to a fuse link, and when electric current abnormally rises to a certain level or the ambient reaches a high temperature, the fuse will be blown on its own, i.e., the fuse changes from a low resistance state to open circuit or a high resistance state, thereby being able to cut off the current. Therefore, in a conventional circuit structure, a fuse mainly plays a role of overload protection, and can ensure safe operation of the circuitry. an anti-fuse device normally is at a high resistance state, but its resistance level is reduced after the anti-fuse is blown/fused.

In the field of integrated circuits, various OTP (OTP) memories can be designed by utilizing the characteristics of fuses and anti-fuses. In the field of integrated circuits, a fuse mostly refers to an electric fuse (eFuse) based on metal electro-migration (EM) characteristics, and the electric fuse is blown to change its resistance value between two ends of the eFuse (from small to large). A polysilicon based anti-fuse refers to a device in which the resistance between the polysilicon layer and a N+ diffusion layer is changed (from large to small) by breaking down the isolation layer between the two layers. Both kinds of the OTP memories store data by converting the resistance of the OTP into a logic value. By adopting the standard CMOS process, the two types of OTP memory units have the advantages of small unit area, low total cost and good safety, but they still have some similar defects as other one-time programmable memories such as limited applications for a user and poor redundancy.

FIG. 1A and FIG. 1B respectively show two implementations of an OTP memory in the current arts. The OTP memories shown in FIG. 1A and FIG. 1B are each composed of an e-fuse structure 110 and a select transistor 120, and the gate of the select transistor 120 constitutes the word line WL of the OTP memory, but the two OTP memories have different port structures and application states. The structure of the OTP memory shown in FIG. 1A has one port (Gnd) set to be fixed at ground, and the current directions in both programing and reading operations are from the Q end of the OTP memory to the Gnd or Vddq/gnd end.

While the structure shown in FIG. 1B sets one port of the OTP memory to be FSource (a programming power source port) which is externally connected to the program voltage (Vddq) during a programming operation and to ground (gnd) during a read operation. The directions of current flow over the electric fuse structure 110 are opposite in these two operation modes.

As shown in FIGS. 1A and 1B, in both types of OTP memories, the occurrence of fuse blowing is an irreversible process, so only one programming operation can be performed. Although the irreversible fuse operation has stable, safe and reliable characteristics and is capable of storing data for a long time, the fuse is only OTP, which limits the user's applications. For example, in order to correct the programming error of the OTP memory, the current applications mainly use the storage redundancy bits set in the OTP memory area, and the location information and the real data values of the OTP memory with the original programming errors are recorded in the redundancy bits by programming the redundancy bits. When the bit address of a programming error is read, the correct information stored in the redundant bit can be automatically read out. However, the redundancy method requires the provision of redundant storage bits and corresponding redundant control circuits, which increases the manufacturing cost and complicates the entire circuit and its layout design and not simple enough.

Therefore, there is a need for a OTP memory and an operation method thereof, which can have a correction function, i.e., a function of once correcting an equivalent resistance level thereof, so as to directly implement a redundant correction of a bit information of a programming error through a suitable programming control by using a secondary programming principle, thereby omitting the redundant storage bit and a corresponding redundant circuit, controlling a manufacturing cost, and effectively simplifying a circuit and a layout design while having flexibility and reliability.

BRIEF SUMMARY OF THE DISCLOSURE

A brief summary on one or more embodiments is given below to explain the disclosure. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

The present disclosure provides a modifiable OTP memory the OTP memory comprises an electric fuse structure, an anti-fuse transistor and a word select transistor, one end of the electric fuse structure is electrically connected to a gate of the anti-fuse transistor to form a first port of the OTP memory, the other end of the electric fuse structure is electrically connected to a source of the anti-fuse transistor and is connected to a drain of the word select transistor, and a gate and a source of the word select transistor respectively form a second port and a third port of the OTP memory.

In an embodiment of the OTP memory, optionally, a program voltage corresponding to a blow current of the electric fuse structure is less than a fusing voltage between a gate and a source of the anti-fuse transistor.

In an embodiment of the OTP memory, optionally, in response to the OTP memory being in a program state, the first port is externally connected to a program voltage to change a resistance level of the OTP memory; and in response to the OTP memory being in a read state, the first port is grounded.

In an embodiment of the OTP memory, optionally, in response to the OTP memory being in a first-time program state, the first port is externally connected to a first program voltage, and the first program voltage enables the electric fuse structure to be fused so as to change the resistance level of the electric fuse structure; and in response to the OTP memory being in a second time program state, the first port is externally connected to a second program voltage which is larger than the first program voltage, and the second program voltage enables the anti-fuse transistor to be fused so as to change the resistance level of the anti-fuse transistor.

In response to the OTP memory being in a second time program state, the first port is externally connected to a second program voltage which is larger than the first program voltage, and the second program voltage enables the anti-fuse transistor to be fused so as to change the resistance level of the anti-fuse transistor.

In an embodiment of the OTP memory, optionally, in response to the OTP memory being in a program state or a read state, the second port externally receives a word line signal that turns on the word select transistor.

In an embodiment of the OTP memory, optionally, the third port is connected to a sense amplifier module and a drain of a bit select transistor; in response to the OTP memory being in a program state, a gate of the bit select transistor is externally connected to a bit line control signal for turning on the bit select transistor, and a source of the bit select transistor is grounded; and in response to the OTP memory being in a read state, the gate of the bit select transistor is externally connected to a bit line control signal for turning off the bit select transistor, and the sensitive amplifier module acquires the level of the read current of the OTP memory so as to read the state data of the OTP memory.

In an embodiment of the OTP memory, optionally, the anti-fuse transistor and/or the word select transistor and/or the bit select transistor is an nMos transistor.

The present disclosure further provides an operation method of an OTP memory, specifically, the OTP memory comprises an electric fuse structure, an anti-fuse transistor and a word select transistor, one end of the electric fuse structure is electrically connected to a gate of the anti-fuse transistor to form a first port of the OTP memory, the other end of the electric fuse structure is electrically connected to a source of the anti-fuse transistor and is connected to a drain of the word select transistor, a gate and a source of the word select transistor respectively form a second port and a third port of the OTP memory, and the third port is connected to a sensitive amplifier module and a drain of a bit select transistor; the operation method comprises at least a programming method, and the programming method comprises at least: externally connecting the first port to a first program voltage to change the resistance level of the OTP memory; externally connecting the second port to a word line signal for turning on the word select transistor; and externally connecting the gate of the bit select transistor to a bit line control signal for turning on the bit select transistor, and grounding a source of the bit select transistor; wherein the first program voltage blows the electric fuse structure to change a resistance level of the electric fuse structure.

In an embodiment of the operation method, optionally, the programming method further comprises: in response to the requirement of modifying the resistance level of the OTP memory after the electric fuse structure is blown, externally connecting the first port to a second program voltage larger than the first program voltage, wherein the second program voltage enables the anti-fuse transistor to be fused so as to change a resistance level of the anti-fuse transistor.

In an embodiment of the operation method, optionally, the operation method further comprises a read method, the read method comprises: grounding the first port; externally connecting the second port to a word line signal for turning on the word select transistor; externally connecting the gate of the bit select transistor to a bit line control signal for turning off the bit select transistor; and acquiring the level of the read current of the OTP memory through the sensitive amplifier module so as to read the state data of the OTP memory.

According to one aspect of the disclosure, the OTP memory provided by the disclosure can have a correction function, namely, the OTP memory has a function of correcting the equivalent resistance level once, so that the redundant correction of the bit information of the programming error can be realized by directly using a secondary programming principle through proper programming control, the redundant storage bit and a corresponding redundant circuit can be omitted, the manufacturing cost is controlled, and the circuit and the layout design thereof can be effectively simplified while the flexibility and the reliability are achieved.

BRIEF DESCRIPTION OF THE DRAWINGS

After reading the detailed description of the embodiments of the present disclosure in combination with the following drawings, the above features and advantages of the disclosure can be better understood. In the drawings, the components are not necessarily drawn to scale, and components with similar related characteristics or features may have the same or similar reference marks.

Figure 1A:
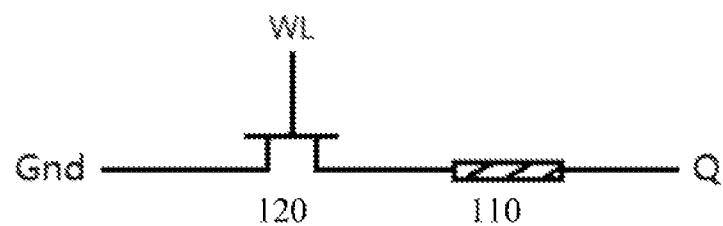
FIGS. 1A and 1B respectively show a structural schematic diagram of a OTP memory according to the existing techniques.
Figure 1B:
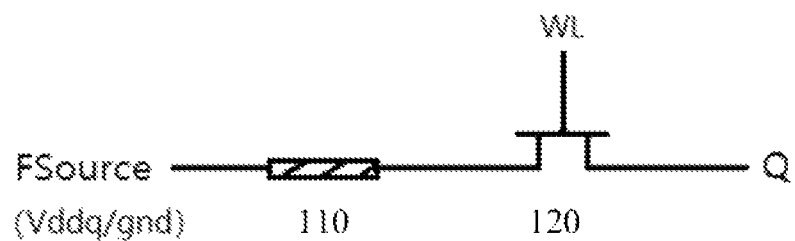

REFERENCE NUMERALS 110 electric fuse structure
120 select transistor
200 one-time programmable memory
211 electric fuse structure
212 anti-fuse transistor
220 word select transistor
300 bit select transistor

DETAILED DESCRIPTION OF THE DISCLOSURE

The following description is presented to enable one of ordinary skill in the art to implement and use the present disclosure and incorporate it into the context of a particular application. Various modifications, as well as various usages in various applications, will be readily apparent to those skilled in the art, and the generic principles defined herein may be applicable to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. However, it will be apparent to those skilled in the art that the present disclosure may be practiced without limitations from these specific details. In other words, well-known structures and devices are shown in a block diagram form and are not shown in detail, so as to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

The disclosure is described in detail below with reference to the figures and the specific embodiments. It is noted that the aspects described below in connection with the figures and the specific embodiments are only illustrative and should not be construed as imposing any limitation on the scope of the present disclosure.

Figure 2:
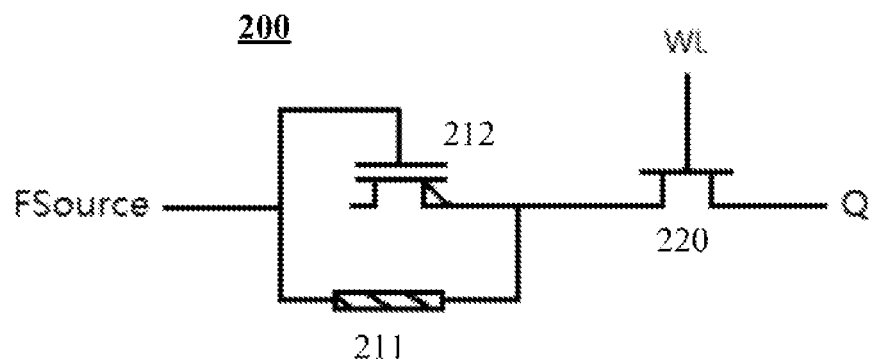
FIG. 2 shows a schematic structural diagram of the OTP memory according to an embodiment of the present disclosure.

To solve the above problems, the present disclosure provides a OTP memory. Referring to FIG. 2, a schematic structural diagram of the OTP memory according to one embodiment of the present disclosure. As shown in FIG. 2, the OTP memory comprises an electric fuse structure 211, an anti-fuse transistor 212, and a word select transistor 220, wherein one end of the electric fuse structure 211 is electrically connected to the gate of the anti-fuse transistor 212 to form a first port (FSource) of the OTP memory 200, the other end of the electric fuse structure 211 is electrically connected to the source of the anti-fuse transistor 212 and is connected to the drain of the word select transistor 220, and the gate and the source of the word select transistor 220 form a second port (WL) and a third port (Q) of the OTP memory 200, respectively.

It will be appreciated that the electric fuse structure 211, the anti-fuse transistor 212 and the word select transistor 220 described above are compatible with the existing or any future standard CMOS processes. For example, the electric fuse structure 211 may comprise a substrate, a polysilicon (doped or undoped) layer formed on the substrate, and a metal polycide layer formed on the surface of the polysilicon layer, and the anti-fuse transistor 212 and the word select transistor 220 may be a NMOS transistor.

Further, in the above embodiment, a programming voltage Vddq corresponding to the blow current Im of the electric fuse structure 211 is lower than the fuse voltage Vpp between the gate and the source of the anti-fuse transistor 212. In the above embodiment, the drain of the anti-fuse transistor 212 may be set to float, or may be set to short (connected) with the source of the anti-fuse transistor 212.

Figure 3:
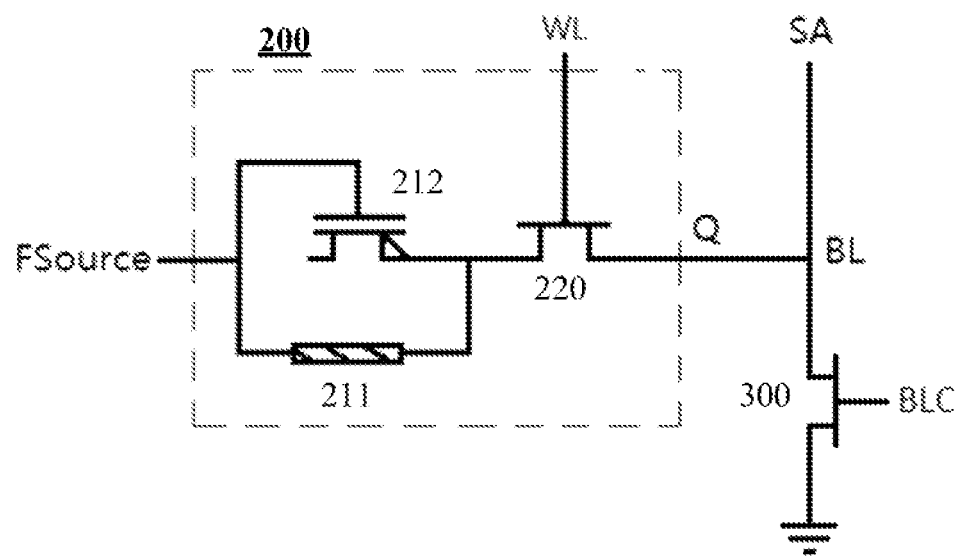
FIG. 3 shows a schematic diagram of an application of the OTP memory according to an embodiment of the present disclosure.

Further referring to FIG. 3 which explains an application diagram of the OTP memory according to an embodiment of the present disclosure. As shown in FIG. 3, the word select transistor 220 of the OTP memory 200 is controlled by a word line (WL), the port Q of the OTP memory 200 forms a bit line (BL), and is connected to a sense amplifier module (SA) and the drain of a bit select transistor 300, a source of the bit select transistor 300 is grounded, and its gate is connected to a bit line control signal (BLC).

For the first port (FSource) of the OTP memory 200, in response to the OTP memory 200 being in the programming state, the first port (FSource) is externally connected to a programming voltage which can change the resistance of the OTP memory 200; in response to the OTP memory 200 being in a read state, the first port (FSource) is grounded.

As described above, the OTP memory provided by one embodiment of the present disclosure has modification capability for once, and therefore, in response to the OTP memory 200 being in the first-time programmable state, the first port (FSource) is externally connected to the first programming voltage Vddq, which blows the eFuse structure 211 to change the resistance level of the eFuse structure 211. It is understood that the blowing process refers to a process of changing (from small to large) the resistance level between the two ends of the fuse according to the electro-migration characteristics of the eFuse metal.

The OTP memory 200 can be programmed a second time when a data state of the OTP memory 200 needs to be corrected. In response to the OTP memory 200 being in the second-time programmable state, the first port (FSource) is externally connected to a second programming voltage Vpp which is larger than the first programing voltage Vddq, and the second programming voltage Vpp fuses the anti-fuse transistor 212 to change the resistance of the anti-fuse transistor 212. It will be appreciated that since the anti-fuse transistor 212 is an NMOS transistor, its fusion refers to the breakdown of the insulating layer between the gate and the source of the NMOS transistor, and its fusion voltage refers to the breakdown voltage of the insulating layer between the gate and source, this breakdown causes the resistance of the anti-fuse transistor to change from large to small.

According to the OTP memory provided by an embodiment of the present disclosure, since the eFuse structure and the anti-fuse transistor are arranged in parallel, the resistance of the OTP memory can be increased (from less than 100 ohms to megaohms or more) by changing the resistance of the eFuse structure during the first programming, so that the data state of the OTP memory can be altered by changing the resistance. On the other hand, during the second programming, the resistance level of the OTP memory can be reduced (to about 5-20K ohms) by changing the resistance level of the anti-fuse transistor, and the data state of the OTP memory can be restored to the state before the first programming by changing the resistance level, thereby enabling the OTP memory to have the capability of correcting error data for another time.

The second port WL of the OTP memory 200 is externally connected to a word line signal that turns on the word select transistor 220 in response to the OTP memory 200 either in a programming state or a read state.

The third port Q of the OTP memory 200 connects to the bit select transistor 300 and the sense amplifier module SA as shown in FIG. 3. In response to the OTP memory being in the programming state, the gate of the bit select transistor 300 is externally connected to a bit line control signal for turning on the bit select transistor 300 and the source of the bit select transistor 300 is grounded. In response to the OTP memory being in a read state, the gate of the bit select transistor 300 is externally connected to a bit line control signal for turning off the bit select transistor 300, and the sense amplifier module SA receives a read current from the OTP memory to read the state data of the OTP memory.

Thus, in a read operation, a read current of the OTP memory flows from SA through the word select transistor 220, and the eFuse structure 211 and the anti-fuse transistor 212 are connected in parallel to ground (FSource). The SA converts the equivalent resistance of the parallelly connected the eFuse structure 211 and the anti-fuse transistor 212 into a corresponding logic value according to the current level. In the initial state of the operation, the parallel resistance of the eFuse structure 211 and the anti-fuse transistor 212 is a low resistance, and the SA output is a logic "0". In the read operation after the first programming, the parallel resistance of the eFuse structure 211 and the anti-fuse transistor 212 turns to a high resistance, and the SA output is logic "1". In the read operation after the second programming, the parallel resistance of the eFuse structure 211 and the anti-fuse transistor 212 becomes low resistance, and the SA output becomes logic "0". Therefore in this embodiment, the second programming modifies the output logic value of the OTP memory cell from "1" back to "0" after the first programming. From the above resistance characteristics, the OTP memory cell provided by an aspect of the present disclosure has the characteristics of an electric fuse structure.

Compared with a conventional OTP unit, the OTP unit provided by this embodiment has the advantage of reprogramming capability, namely, after the normal programming operation is carried out on the OTP unit, a user can carry out one-time correction operation on the programming result. Prior to programming, OTP memory cells provided by the embodiment are in state "0"; after the first programming, the state of the OTP memory cell changed to "1"; the state of the OTP memory cell can be corrected back to "0" again by a second programming.

As described above, in the prior art, in order to correct the programming error of a conventional OTP unit, redundant bits are often set in a storage area formed by the OTP unit, and by programming the redundant bits, information of the error data is located and a real value is recorded in the redundant bits. When the user reads the address of the bit with error, the system will read out the correct information stored in the redundant bit automatically.

The OTP memory unit provided by the disclosure has the capability of modifying the equivalent resistance of the OTP memory unit in terms of the hardware, and can realize redundant correction of the wrong bit information by properly programming the power-on time sequence by directly utilizing the secondary programming principle. Because redundant bits and redundant circuits are omitted, the circuit and layout design are simplified, and the flexibility and the reliability are improved. The OTP memory unit provided by the disclosure not only keeps the reliability of the stored data, but also provides the opportunity to correct the one-time stored data, and expands application range and adaptability of an OTP memory.

The disclosure also provides an operation method of the OTP memory. The above operation method at least comprises a programming method, which at least comprises: connecting the first port with a first program voltage externally to change the resistance level of the OTP memory; connecting a word line signal to the second port externally to turn on the word select transistor; and connecting the gate of the bit select transistor with a bit line control signal which turning on the bit select transistor, and grounding the source of the bit select transistor; the first program voltage fuses the electric fuse structure to change a resistance of the electric fuse structure.

Since the OTP memory has a correction capability, the programming method further comprises: in response to the requirement of correcting the resistance level of the OTP memory after the electric fuse structure is fused, externally connecting a second program voltage which is larger than the first programming voltage to the first port, wherein the second programming voltage fuses the anti-fuse transistor to change the resistance level thereof.

In an embodiment, the operation method further comprises a reading method, which specifically comprises: grounding the first port; connecting the second port externally to a word line signal for turning on the word select transistor; connecting a gate of the bit select transistor externally to a bit line control signal for turning off the bit selection transistor; and obtaining the reading current of the OTP memory through the sensitive amplifier module so as to read the state data of the OTP memory.

Figure 4A:
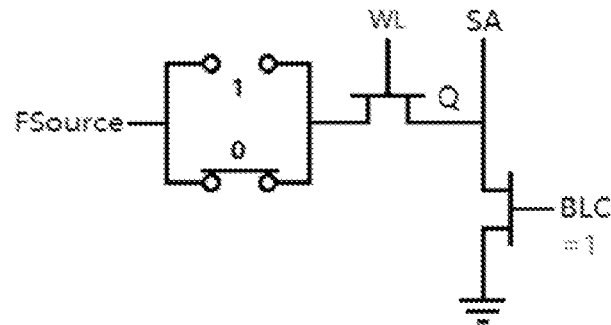
FIG. 4A shows a schematic diagram of a programming initial state of the OTP memory according to an embodiment of the present disclosure.
Figure 4B:
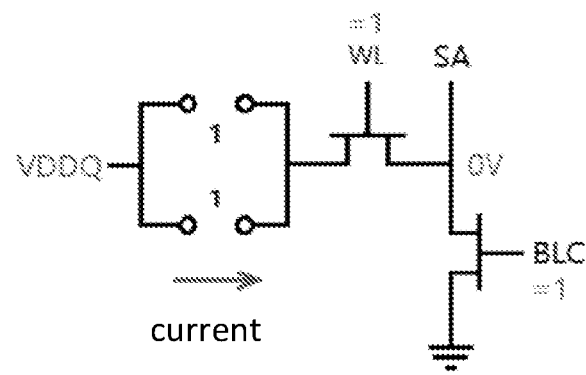
FIG. 4B shows a schematic diagram of a first time programming state of the OTP memory according to an embodiment of the present disclosure.
Figure 4C:
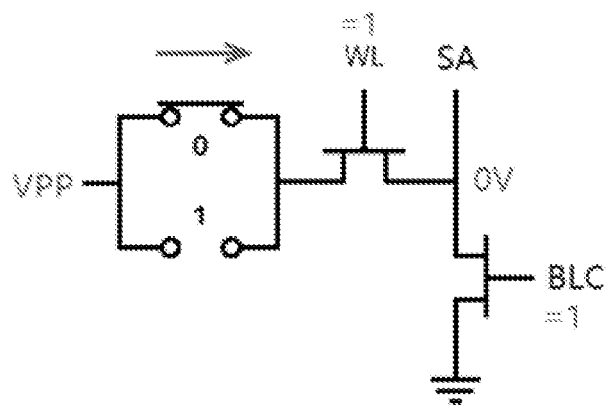
FIG. 4C shows a schematic diagram of a second time programming state of the OTP memory according to an embodiment of the present disclosure.

Referring to FIG. 4A, FIG. 4B, and FIG. 4C for explaining the programming operation of the OTP memory according to an aspect of the present disclosure. FIG. 4A shows a schematic diagram of a programming initial state of the OTP memory provided by an embodiment of the present disclosure. FIG. 4B shows a schematic diagram of a first-time programming state of the OTP memory provided by an embodiment of the present disclosure. FIG. 4C shows a schematic diagram of a second-time programming state of the OTP memory provided by an embodiment of the present disclosure.

As shown in FIG. 4A, in the OTP memory according to one embodiment of the present disclosure, before programming, the eFuse structure 211 exhibits a low resistance state "0" in an initial state (pre) and a high resistance state "1" between the gate and the source of the anti-fuse transistor 212. Because the eFuse structure 211 and the anti-fuse transistor 212 are mutually connected in parallel, the whole OTP memory unit presents a low-resistance state before programming, and the logic state of the OTP memory unit is defined as "0".

As can be seen from the above description, the blow current of electric fuse structure 211 (corresponding to the programming voltage VDDQ) is Im and the breakdown voltage of the insulating layer between the gate and the source of anti-fuse transistor 212 is VPP (greater than VDDQ). In the first programming (normal programming)

operation, as shown in FIG. 4B, the port FSource is set to be VDDQ, the programming time is Te and WL are high, the word select transistor 220 is turned on, the BLC is high, the bit select transistor 300 is turned on, the programming current flows through the electric fuse structure 211, the electro-migration phenomenon occurs, the fuse resistance increases sharply, and the high-resistance state is exhibited. Since VDDQ is still smaller than VPP, no breakdown occurs between the gate and source of anti-fuse transistor 212, and the high resistance state is maintained. Therefore, after normal programming, the entire OTP memory cell exhibits a high resistance state, defined as a logic state "1".

A second programming operation (correction programming) may be performed on the OTP memory cell when the logic value of the programmed OTP memory cell needs to be corrected (from the programmed "1" back to "0" again). Specifically, as shown in FIG. 4C, the port FSource is set to be VPP, the programming time is Tm, and WL are high, and the word select transistor 220 is turned on; BLC is high and bit select transistor 300 is turned on. Therefore, the programming voltage VPP is applied between the gate and the source of the anti-fuse transistor 212, so that the insulating layer thereof is broken down, a fuse phenomenon occurs, the resistance level between the gate and the source is reduced, and the entire OTP memory cell exhibits a low resistance, i.e., is reprogrammed to a logic state "0".

Figure 5A:
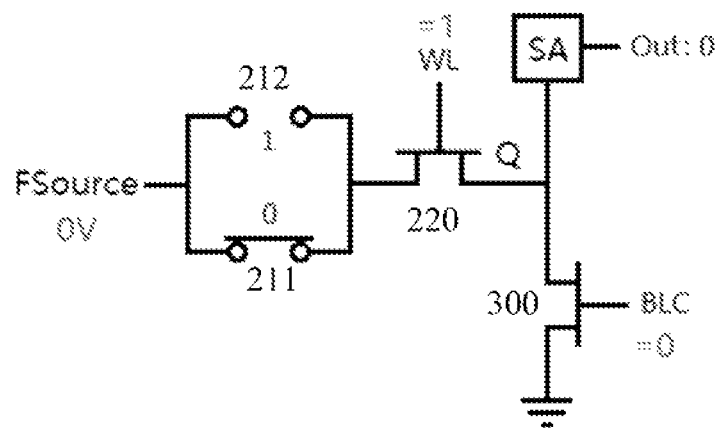
FIG. 5A shows a schematic diagram of a read initial state of the OTP memory according to an embodiment the present disclosure.
Figure 5B:
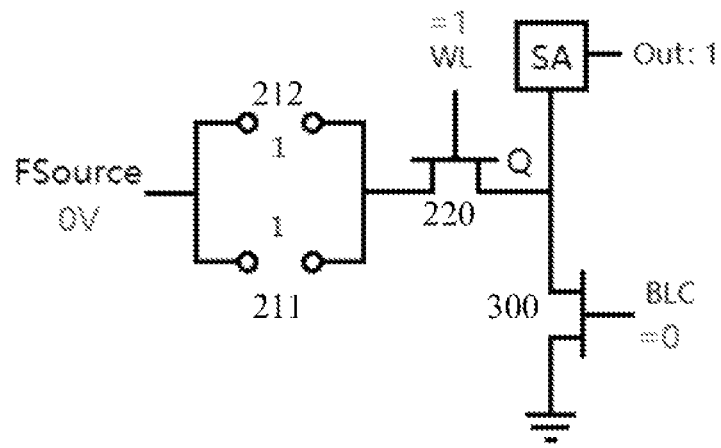
FIG. 5B shows a schematic diagram of a read state after a first-time-programming of the OTP memory according to an embodiment of the present disclosure.
Figure 5C:
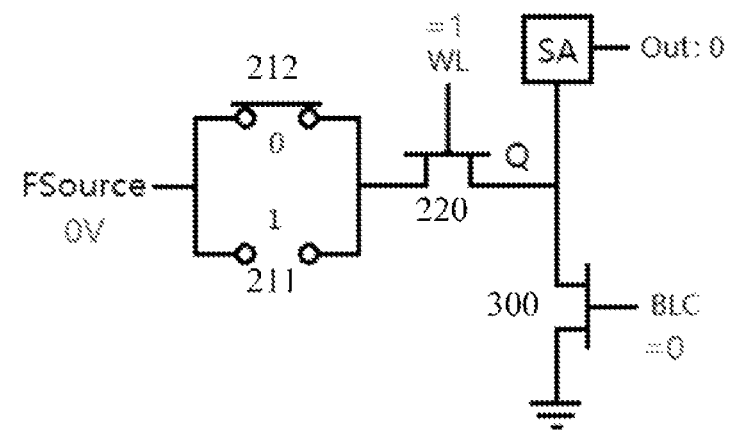
FIG. 5C shows a schematic diagram of a read state after a second-time-programming of the OTP memory according to an embodiment of the present disclosure.

Please refer to FIG. 5A, FIG. 5B, and FIG. 5C to understand the read operation of the OTP memory according to an embodiment of the present disclosure. FIG. 5A shows a schematic diagram of a read initial state of the OTP memory provided by an embodiment of the present disclosure. FIG. 5B shows a schematic diagram of a read state after a first-time programming of the OTP memory provided by an embodiment of the present disclosure. FIG. 5C shows a schematic diagram of a read state after a second-time programming of the OTP memory provided by an embodiment of the present disclosure.

In the read mode, as shown in FIGS. 5A, 5B, and 5C, the OTP memories are all configured with the port F Source being grounded, WL being high, word select transistor 220 being turned on, BLC being low, and bit select transistor 300 being turned off. The read current is determined by the equivalent resistance between the port Q and the port FSource of the OTP memory cell (mainly determined by the resistance of the eFuse structure 211 and the anti-fuse transistor 212 in parallel), and then converted to a logic value "0" or "1" by SA for output. Specifically, in FIG. 5A, the resistance of the eFuse structure 211 and the anti-fuse transistor 212 in parallel is in a low resistance state, and outputs a logic value "0" after SA conversion. In FIG. 5B, the resistance of the eFuse structure 211 and the anti-fuse transistor 212 in parallel is in a high-impedance state, and outputs a logic value "1" after SA conversion. In FIG. 5C, the parallel resistance of the electric fuse structure 211 and the anti-fuse transistor 212 is in a low resistance state, and outputs a logic value "0" after SA conversion.

In summary, the operation method of the OTP memory provided in one embodiment of the present disclosure is described in the following two tables. Table 1 shows the results following the programming operation method of the OTP memory provided in one embodiment of the present disclosure, and Table 2 shows the reading operation method of the OTP memory provided in one embodiment of the present disclosure. Where a value of "1" indicates access to VDD (high level) and a value of "0" indicates GND (ground).

TABLE 1

| signal | The first-time programming | The second-time programming |
|---|---|---|
| WL | 1 | 1 |
| BLC | 1 | 1 |
| FSOURCE | VDDQ | VPP |

TABLE 2

| signal | Initial reading | Reading after the first-time programming | Reading after the second-time progmmming |
|---|---|---|---|
| WL | 1 | 1 | 1 |
| BLC | 0 | 0 | 0 |
| FSOURCE | 0 | 0 | 0 |

Since the OTP memory unit provided by the disclosure has the condition of modifying the equivalent resistance level of the OTP memory unit from the embodiment of hardware, in the operation method of the OTP memory unit provided by the disclosure, the redundant correction of wrong bit information can be realized by properly programming the power-on time sequence by directly utilizing the secondary programming principle. Due to redundant bits and redundant circuits are omitted, the circuit and layout design is simplified, and the flexibility and the reliability are improved. The OTP memory unit and the operation method thereof provided by the disclosure not only keep the reliability of the stored data, but also provide the opportunity of correcting the one-time stored data, and expand the application range and the adaptability of the OTP memory.

Thus, embodiments of the OTP memory and an operation method thereof provided by the present disclosure have been described. Although the present disclosure has been described with respect to exemplary embodiments, it will be evident that various modifications and changes may be made to these embodiments without departing from the broader spirit and scope of the disclosure. The specification and drawings are, accordingly, to be regarded in an illustrative sense rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A modifiable one-time programmable memory, comprising:
   an electric fuse structure;
   an anti-fuse transistor; and
   a word select transistor;
   wherein one end of the electric fuse structure is electrically connected to a gate of the anti-fuse transistor to form a first port of the one-time programmable memory, another end of the electric fuse structure is electrically connected to a source of the anti-fuse transistor and a drain of the word select transistor; and wherein a gate and a source of the word select transistor form a second port and a third port of the one-time programmable memory respectively.

2. The modifiable one-time programmable memory of claim 1, wherein a program voltage corresponding to a blow current of the electric fuse structure is less than a fusing voltage between the gate and the source of the anti-fuse transistor.

3. The modifiable one-time programmable memory of claim 1, wherein in response to the one-time programmable memory being in a program state, the first port is externally connected to a program voltage to change a resistance level of the one-time programmable memory; and
   wherein in response to the one-time programmable memory being in a read state, the first port is grounded.

4. The modifiable one-time programmable memory of claim 3, wherein in response to the one-time programmable memory being in a first-time program state, the first port is externally connected to a first program voltage, wherein the first program voltage enables the electric fuse structure to be fused so as to change the resistance level of the electric fuse structure; and
   wherein in response to the one-time programmable memory being in a second time program state, the first port is externally connected to a second program voltage which is larger than the first program voltage, and wherein the second program voltage enables the anti-fuse transistor to be fused so as to change the resistance level of the anti-fuse transistor.

5. The modifiable one-time programmable memory of claim 1, wherein in response to the one-time programmable memory being in a program state or a read state, the second port externally receives a word line signal that turns on the word select transistor.

6. The modifiable one-time programmable memory of claim 1, wherein the third port is connected to a sense amplifier module and a drain of a bit select transistor;
   wherein in response to the one-time programmable memory being in a program state, a gate of the bit select transistor is externally connected to a bit line control signal for turning on the bit select transistor, and a source of the bit select transistor is grounded; and
   wherein in response to the one-time programmable memory being in a read state, the gate of the bit select transistor is externally connected to a bit line control signal for turning off the bit select transistor, and the sensitive amplifier module acquires a value of a read current of the one-time programmable memory so as to read state data of the one-time programmable memory.

7. The modifiable one-time programmable memory of claim 6, wherein the anti-fuse transistor and/or the word select transistor and/or the bit select transistor is an NMOS transistor.

8. An operation method of an one-time programmable memory, wherein the one-time programmable memory comprises an electric fuse structure, an anti-fuse transistor and a word select transistor, wherein one end of the electric fuse structure is electrically connected to a gate of the anti-fuse transistor to form a first port of the one-time programmable memory, the other end of the electric fuse structure is electrically connected to a source of the anti-fuse transistor and is connected to a drain of the word select transistor, a gate and a source of the word select transistor form a second port and a third port of the one-time programmable memory respectively, and the third port is connected to a sensitive amplifier module and a drain of a bit select transistor;
   wherein the operation method comprises at least a programming method, wherein the programming method comprises at least:
   externally connecting the first port to a first program voltage to change a resistance level of the one-time programmable memory;
   externally connecting the second port to a word line signal for turning on the word select transistor; and
   externally connecting a gate of the bit select transistor to a bit line control signal for turning on the bit select transistor, and grounding a source of the bit select transistor;
   wherein the first program voltage blows the electric fuse structure to change the resistance level of the electric fuse structure.

9. The operation method of claim 8, wherein the programming method further comprises:
   in response to a requirement of modifying the resistance level of the one-time programmable memory after the electric fuse structure is blown, externally connecting the first port to a second program voltage larger than the first program voltage, wherein the second program voltage enables the anti-fuse transistor to be fused so as to change a resistance level of the anti-fuse transistor.

10. The operation method of claim 8, wherein the operation method further comprises a read method, comprising:
    grounding the first port;
    externally connecting the second port to a word line signal for turning on the word select transistor;
    externally connecting the gate of the bit select transistor to the bit line control signal for turning off the bit select transistor; and
    acquiring a level of a read current of the one-time programmable memory through the sensitive amplifier module so as to read state data of the one-time programmable memory.

* * * * *